(12) United States Patent
Zargari

(10) Patent No.: US 6,351,502 B1
(45) Date of Patent: Feb. 26, 2002

(54) RF FRONT-END WITH MULTISTAGE STEPDOWN FILTERING ARCHITECTURE

(75) Inventor: Masoud Zargari, Mountain View, CA (US)

(73) Assignee: Atheros Communications, Inc., Sunnyvale, CA (US)

(*) Notice: Subject to any disclaimer, the term of this patent is extended or adjusted under 35 U.S.C. 154(b) by 0 days.

(21) Appl. No.: 09/483,948

(22) Filed: Jan. 13, 2000

(51) Int. Cl.[7] ................................................ H04B 1/10
(52) U.S. Cl. ........................ 375/324; 455/285; 455/302
(58) Field of Search ................................. 375/324, 329, 375/346; 455/302, 285, 313, 323; 327/113, 551

(56) References Cited

U.S. PATENT DOCUMENTS

| | | | | |
|---|---|---|---|---|
| 5,625,307 A | * | 4/1997 | Scheinberg | 327/113 |
| 6,054,948 A | * | 4/2000 | Dean | 342/372 |
| 6,148,181 A | * | 11/2000 | Otaka | 455/86 |

* cited by examiner

Primary Examiner—Amanda T. Le
(74) Attorney, Agent, or Firm—Blakely, Sokoloff, Taylor & Zafman LLP (57) ABSTRACT

A radio-frequency (RF) front-end is described. In one embodiment, the RF front-end comprises a low noise amplifier (LNA), a first mixer and an I/Q quadrature mixer. The LNA amplifies a received signal at a carrier frequency, the LNA having inductive loads. The first mixer is coupled to the low noise amplifier and mixes an amplified received signal with a first local oscillator (LO) signal to down convert the amplified received signal to an intermediate frequency (IF). The first mixer has inductive loads. The first frequency is related to the carrier frequency such that an image channel associated with the carrier and the LO frequency is outside the bandwidth of the inductive loads of the LNA. The I/Q quadrature mixer stage has a second mixer and a third mixer coupled to the first mixer. The I/Q quadrature mixer converts the amplified received signal at the IF to I and Q signals using a second LO signal related to the first LO signal.

14 Claims, 7 Drawing Sheets

RF FRONT-END WITH MULTISTAGE STEPDOWN FILTERING ARCHITECTURE

FIELD OF THE INVENTION

The present invention relates to the field of signal processing; more particularly, the present invention relates to multistage step down filtering in radio-frequency (RF) front-ends in systems such as communications systems.

BACKGROUND OF THE INVENTION

A communication system transfers information between a source and a destination. Generally, a communication system includes a transmitter and a receiver which transmit and receive information signals over some media, respectively. This media may be cable wiring or atmosphere. When communications occur over atmosphere, or air waves, they are commonly referred to as "wireless" communications. Examples of wireless communications systems include digital cellular, packet data paging and digital cordless telephones, wireless modems, wireless local and wide area networks, digital satellite communications and personal communications networks.

Communication receivers have a number of different architectures, including superheterodyne and direct conversion. These approaches have a number of different problems associated with them. For example, in superheterodyne approaches, the low intermediate frequency (IF) required for use with certain filters results in an image channel that is fairly close to the desired RF signal. To compensate for this close image channel, the receiver requires a sharp image-rejection filter in the front-end in order to provide enough image suppression prior to mixing. Direct conversion architectures can be designed so that the image signal and the desired channel are essentially the same so that there is no need for an image rejection filter. However, imperfect isolation between the local oscillator (LO) and the antenna results in the LO signal being detected by the antenna, thereby producing a DC component at the output of the receivers. Also, most of the signal amplification is usually performed at the baseband and consequently the signal level at the input of channel-selection filters may be low enough to be completely masked by the 1/f noise.

Figure 7:
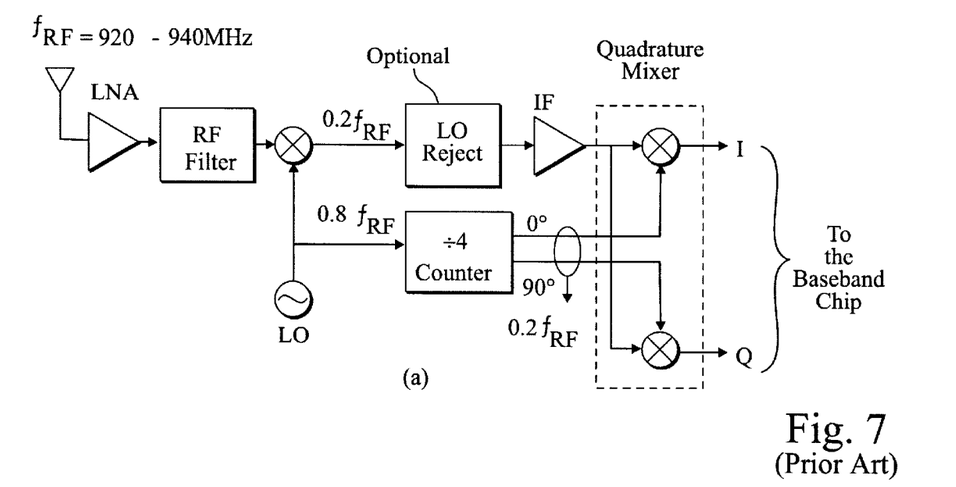
FIG. 7 is a block diagram of an RF front-end using a double down conversion approach.
Figure 8:
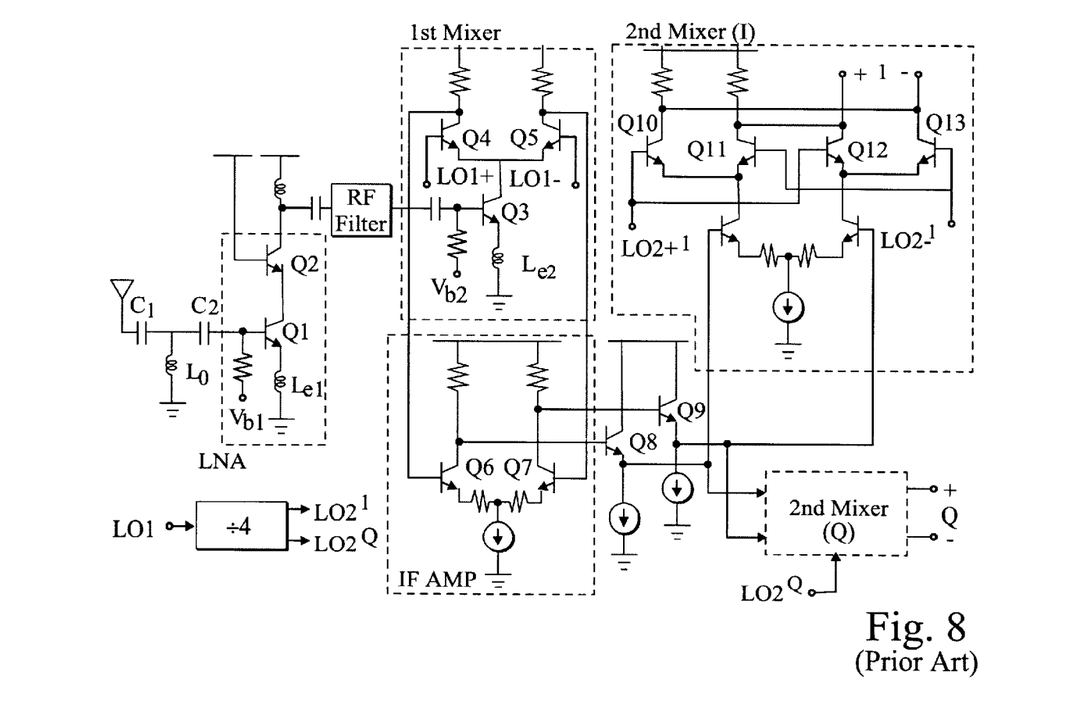
FIG. 8 is a schematic of the RF front-end shown in FIG. 7.

An approach that overcomes the problems described above for paging applications is shown in an article by Saneilevici et al., entitled "A 900-MHz Transceiver Chipset for Two-way Paging Applications," IEEE Journal of Solid-state Circuits, Vol. 33, No. 12, December 1998. FIG. 7 is a block diagram of an RF front-end using a double down conversion approach. FIG. 8 is a schematic of the RF front-end shown in FIG. 7. The architecture uses an RF filter to reduce the LO interference and an LO reject filter to filter the LO from the desired signal. As the design is for paging applications, one problem with this approach is the difficulty in scaling it to support signals at higher frequencies. One reason that the approach is difficult to scale to higher signal bandwidths is because at higher bandwidths, RF filters and LO rejection filters produce higher thermal noise.

SUMMARY OF THE INVENTION

A radio-frequency (RF) front-end is described. In one embodiment, the RF front-end comprises a low noise amplifier (LNA), a first mixer, and an I/Q quadrature mixer. The LNA amplifies a received signal at a carrier frequency, and has inductive loads. The first mixer is coupled to the low noise amplifier and mixes an amplified received signal with a first local oscillator (LO) signal to if down convert the amplified received signal to an intermediate frequency (IF). The first mixer has inductive loads. The first frequency is related to the carrier frequency such that an image channel associated with the carrier and the frequency of the LO signal is outside the bandwidth of the inductive loads of the LNA. The I/Q quadrature mixer stage has a second mixer and a third mixer coupled to the first mixer. The I/Q quadrature mixer converts the amplified received signal at the IF to I and Q signals using a second LO signal related to the first LO signal.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A mixer for use in generating signals is described. In the following description, numerous details are set forth, such as frequencies, protocols, etc. It will be apparent, however, to one skilled in the art, that the present invention may be practiced without these specific details. In other instances, well-known structures and devices are shown in block diagram form, rather than in detail, in order to avoid obscuring the present invention.

Overview

Using an implementation with inductor-based loads (i.e., inductive loaded), as opposed to resistor-based loads, in combination with the proper selection of mixer local oscillator (LO) frequencies, a RF front-end is described below that has advantages over prior art approaches that are achieved with a simplified architecture. The architecture is a down conversion implementation that includes a low noise amplifier (LNA) and a down converting mixer. The LNA and the down converting mixer are inductive-loaded. Therefore, by properly selecting the IF frequency for the down converting mixer, the image channel and all other undesired channels will be placed outside the bandwidth of the inductive loads. In other words, the LO frequency employed by the mixer, in relation to the RF carrier, is low enough to avoid having to use a separate RF filter between a LNA and a down converting mixer and avoid having to use a separate LO rejection filter between a down converting mixer and an I/Q quadrature mixer.

The frequency of the signal used by the LO is selected so that there is a predetermined minimum separation between the RF carrier frequency and the LO frequency. In one embodiment, the selection of the LO frequency results in a separation of approximately 900 MHz or greater between the RF carrier frequency and the LO frequency. In one embodiment, the intermediate frequency (IF) used by the LO is selected to be no closer than 80 percent of the RF carrier, or approximately 80 percent.

Figure 1:
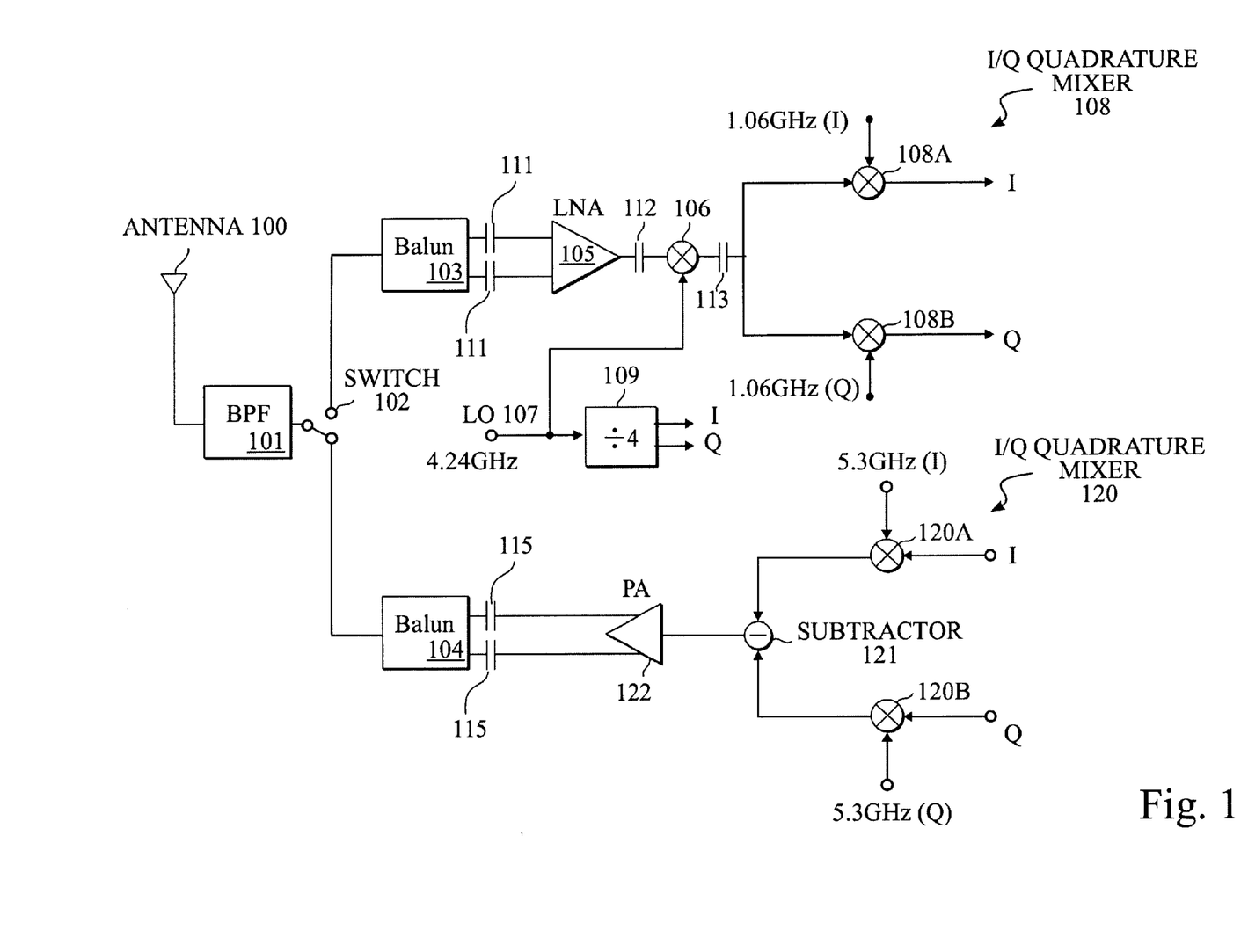
FIG. 1 is a block diagram of one embodiment of front-end circuitry for use in a communications device.

FIG. 1 illustrates one embodiment of a communication transceiver having a RF front end. Referring to FIG. 1, when performing as a receiver, an antenna 100 receives a signal. In one embodiment, the RF signal is at 5 GHz. The signal may be any wireless communication signal (e.g., a communication signal for cellular, WLAN, cordless phone, etc.).

The signal is initially input to a bandpass filter (BPF) 101. A switch 102 is coupled to BPF 101 and operates to switch use of the antenna 100 between receive and transmit paths. Switch 102 is coupled to a balanced-to-unbalanced (balun) transformer 103 on the receive path and a balun transformer 104 on the transmit path. BFT 101, switch 102 and balun transformers 103 and 104 operate in a manner well-known in the art.

A low-noise amplifier (LNA) 105 is coupled to balun transformer 103 using coupling capacitors 111. LNA 105 amplifies the received signal in a manner well-known in the art. The output of LNA 105 is coupled to mixer 106 via coupling capacitors 112.

The received signal is input to a mixer 106, which downconverts the RF frequency of the received signal to an IF frequency by using a second signal from a local oscillator (LO) 107. In one embodiment, the LO signal that is input to the mixer 106 has a RF frequency of 4.24 GHz. Thus, mixer 106 downconverts the signal to approximately 1 GHz or ⅕ of the frequency of the RF carrier.

As discussed herein, an image reject filter to filter an image channel from the received signal created due to the conversion of the mixer is not needed because the image is at 3 GHz, which is nearly 2 GHz from the input signal.

The output of the mixer 106 is coupled to a second mixer stage 108 using coupling capacitor 113. In one embodiment, an intermediate frequency (IF) amplifier is coupled between mixer 106 and second stage mixer 108. Second mixer stage 108 is an I/Q quadrature mixer having I mixer 108A and Q mixer 108B. The oscillator frequency input for mixers 108A–B is coupled to divide-by-four 109. Designed in double-balanced architecture, the I and Q mixers inherently eliminate any LO component in their output.

Divide-by-four 109 divides the frequency of the LO signal by four and outputs the divided signal to mixers 108A and 108B as a second local oscillator. In this manner, the second LO is ¼ of the first LO. In one embodiment, the I and Q outputs are 1.06 GHz. In one embodiment, the I/Q downconversion is to baseband. In an alternative embodiment, the first I/Q downconversion may be to other than baseband.

Figure 2:
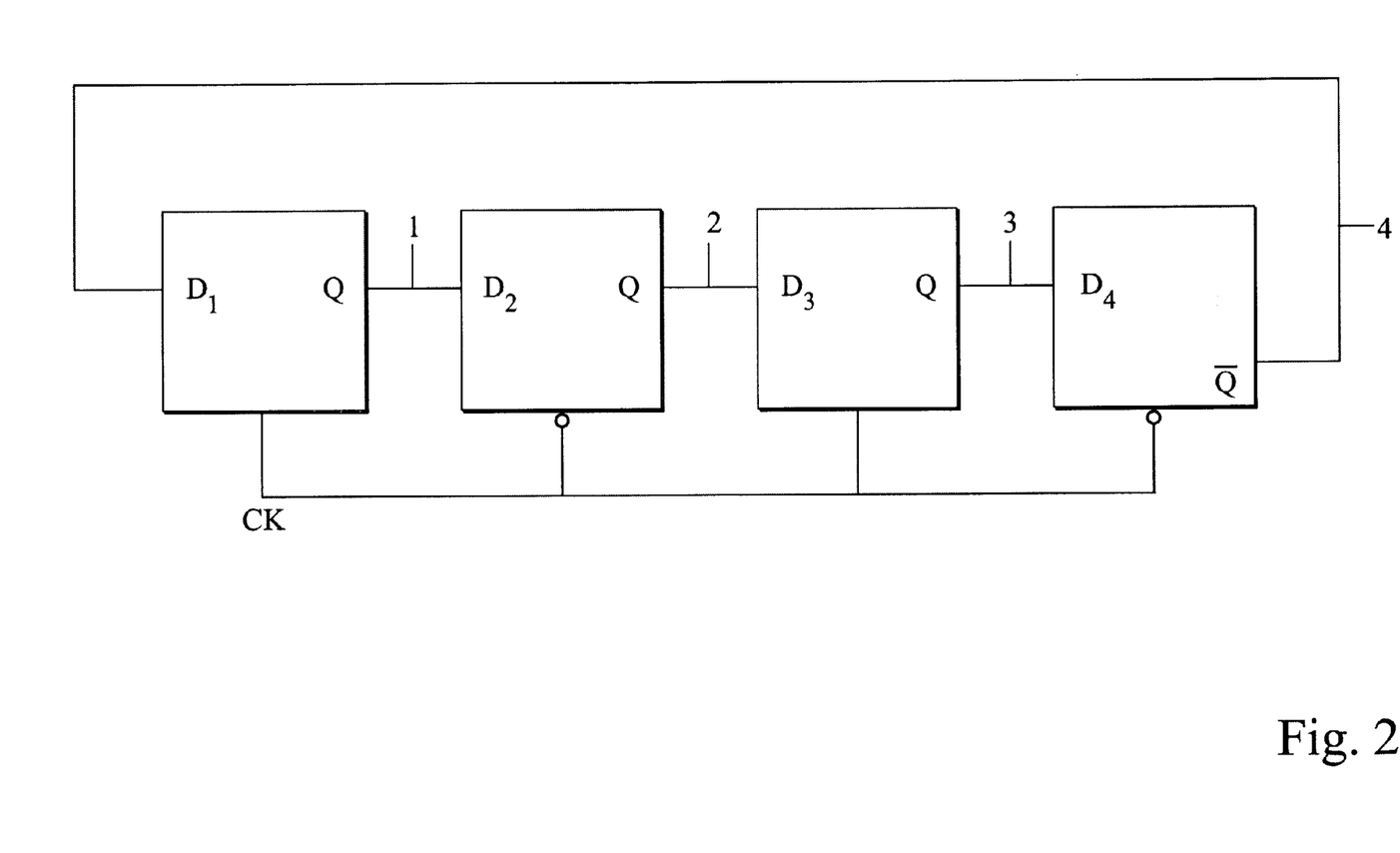
FIG. 2 illustrates one embodiment of a divide-by-four circuit.

In one embodiment, divide-by-four 109 comprises a digital divide-by-four circuit like circuit shown in FIG. 2. Referring to FIG. 2, the latches are common D flip-flops which are known in the art. The outputs at 1 and 3 are 90 degrees out of phase with respect to the outputs at 2 and 4. Any flip-flop device may be used. That is, the circuit is not limited to D type latches. The generation of accurate 90 degrees phase shifted signals is an advantage over a single conversion approach. Also, the divide-by-four approach moves the image frequency to ⅗ of the RF frequency facilitating RF image rejection by the LNA. In an alternative embodiment, divide-by-four 109 is implemented as a counter with a twisted ring architecture, where the counter comprises two master-slave flip-flops, each realized with current-steering fully differential latch.

In one embodiment, the first local oscillator frequency is approximately no more than eighty percent of the RF carrier. This ensures that the second local oscillator signals applied to the second mixer can still receive one fourth of the first local oscillator as its input while being able to avoid having to include a separate RF filter and LO rejection filter in the RF front-end. In addition to the frequency scheme described above, in another example, assuming the incoming signal is 7 GHz, the first local oscillator would have to be no greater than 5.6 GHz, with the second local oscillator signals being one-fourth of those.

The outputs of mixers 108A and 108B comprise the I and Q signal outputs, respectively, of the RF front-end. These outputs represent the received signal.

The RF front-end also includes a transmit path that includes I/Q quadrature mixer 120 comprising I mixer 120A and Q mixer 120B, both of which receive 5.3 GHz LO signals from a LO (not shown). The outputs of I mixer 120A and Q mixer 120B are combined by subtractor 121 and are input into power amplifier 122, which amplifies the signal to be transmitted. The transmitted signal is coupled to balun transformer 104 using coupling capacitors 115 and 116.

An Exemplary Schematic of the RF Front-end

Figure 3:
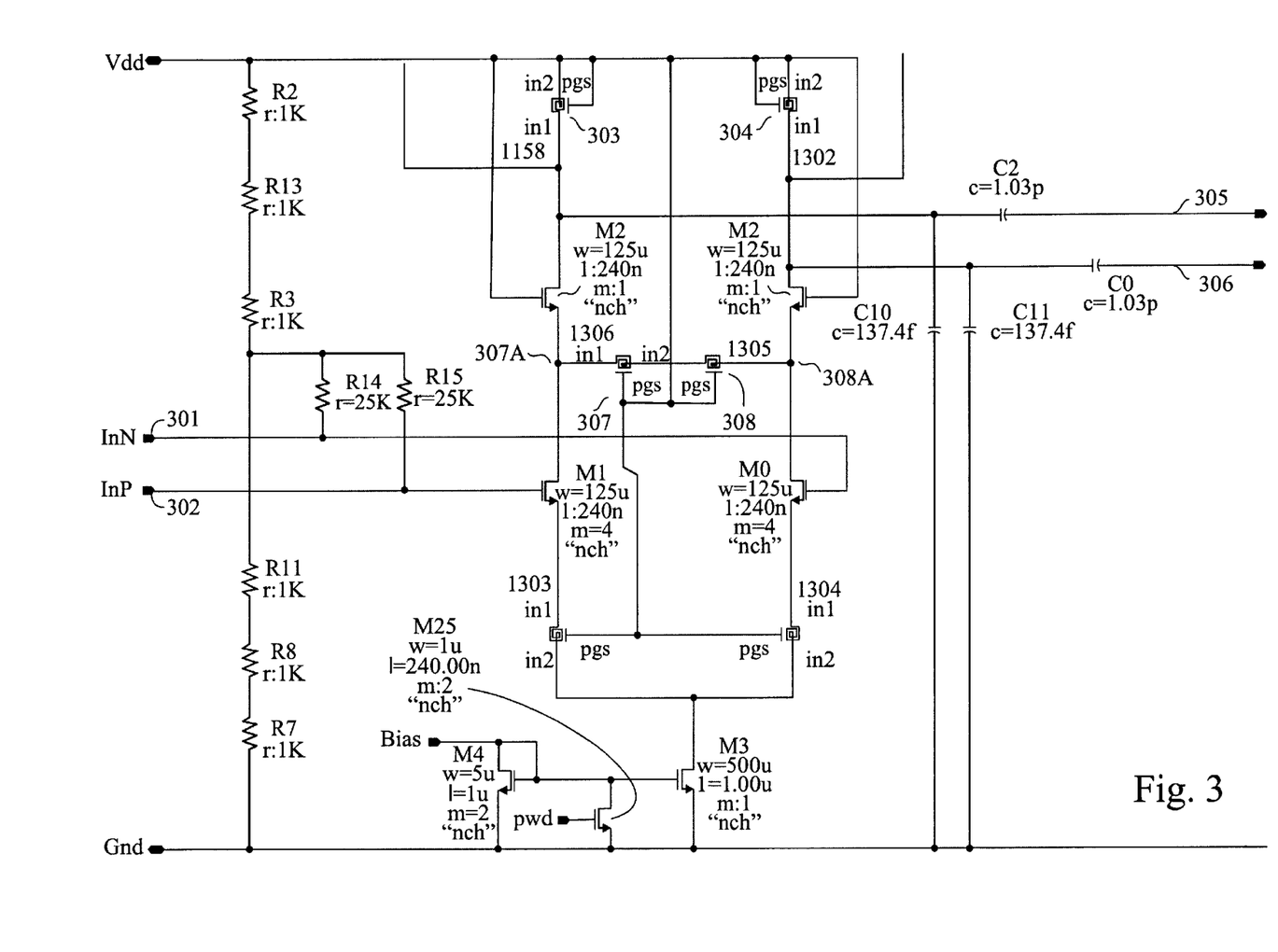
FIG. 3 is a schematic of one embodiment of a low noise amplifier (LNA).

FIG. 3 is one embodiment of an LNA that may be used in the RF front end. Referring to FIG. 3, a pair of differential inputs 301 and 302 are cascode connected to a pair of loads 303 and 304. As discussed above, the loads are not resistor-based loads. In essence, the resistors have been removed from the amplifier loads 103 and 104 and have been replaced with inductive loads. In one embodiment, each of these inductive loads comprises a LC circuit having a capacitor and an inductor coupled in parallel. The LC circuits have a low bandwidth. In one embodiment, the LC circuit is tuned to 5 GHz and only has a bandwidth of approximately 200 MHz. The amplified signals are output on outputs 305 and 306. Inducators 307 and 308 are included and operate as a noise pair to substantially cancel the parasitic capacitance created at nodes 307A and 308A. The operation of the circuit shown in FIG. 3 would be apparent to one skilled in the art.

Use of the inductive load, in combination with the proper frequency selection, eliminates the need for an image rejection filter. That is, for example, if the incoming signal is at 5 GHz for a LO at 4 GHz, then the image is located at 3 GHz. This results in a difference of 2 GHz between the incoming signal and the image signal. Because the image signal is 2 GHz away from the incoming signal, the image signal is outside the bandwidth of the LC circuit and therefore has no effect on the incoming signal (i.e., doesn't create noise). Thus, an image filter is not necessary.

Note that the front end described herein also is not the result of simply scaling the prior art implementation discussed above. Simply scaling the prior art implementation results in noise being generated because the resistors generate thermal noise, particularly if the prior art implementation is scaled to 5 GHz. The implementation described above substantially eliminates the thermal noise.

Figure 4:
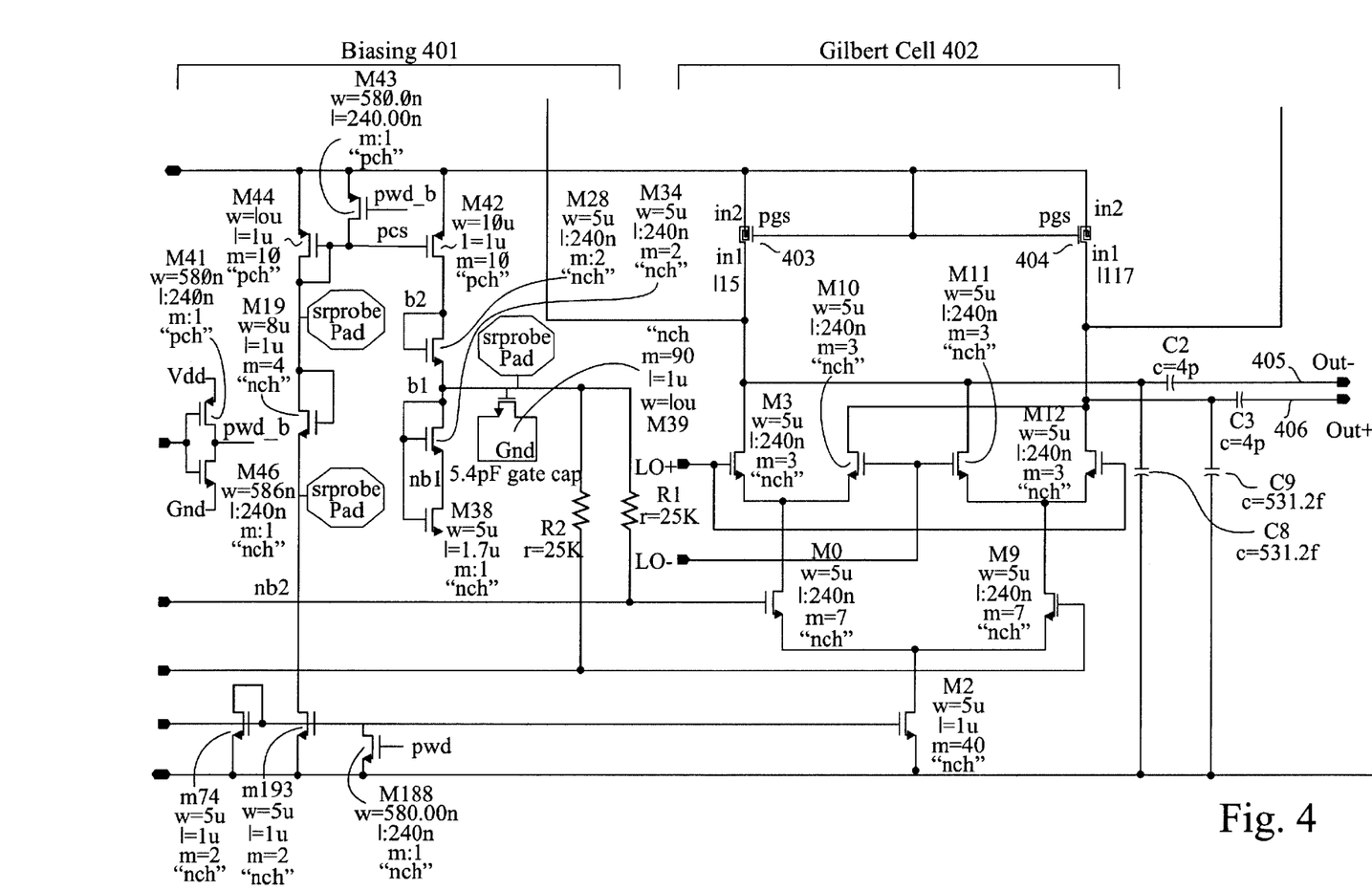
FIG. 4 is a schematic of one embodiment of a mixer.

FIG. 4 is one embodiment of the first mixer stage, which is capacitively coupled to the LNA. Referring to FIG. 4, the first mixer stage includes a biasing portion 401 and a Gilbert cell 402. The operation of biasing portion 401 would be apparent to one skilled in the art. Gilbert cell 402 performs the mixing operation using the local oscillator signal received on inputs LO+ and LO−. Gilbert cell 402 is described in more detail in U.S. Pat. No. 6,242,963, entitled "Differential Mixer with Improved Linearity," filed Sep. 9, 1999, issued Jun. 5, 2001, and assigned to the corporate assignee of the present invention and incorporated herein by reference. As with the LNA above, loads 403 and 404 are inductive loads in the form of LC circuits having an inductor and a capacitor coupled in parallel. In one embodiment, the LC circuit is tuned to 1 GHz. The results of the mixing operation performed by the first mixer stage are output on outputs 405 and 406.

Figure 5:
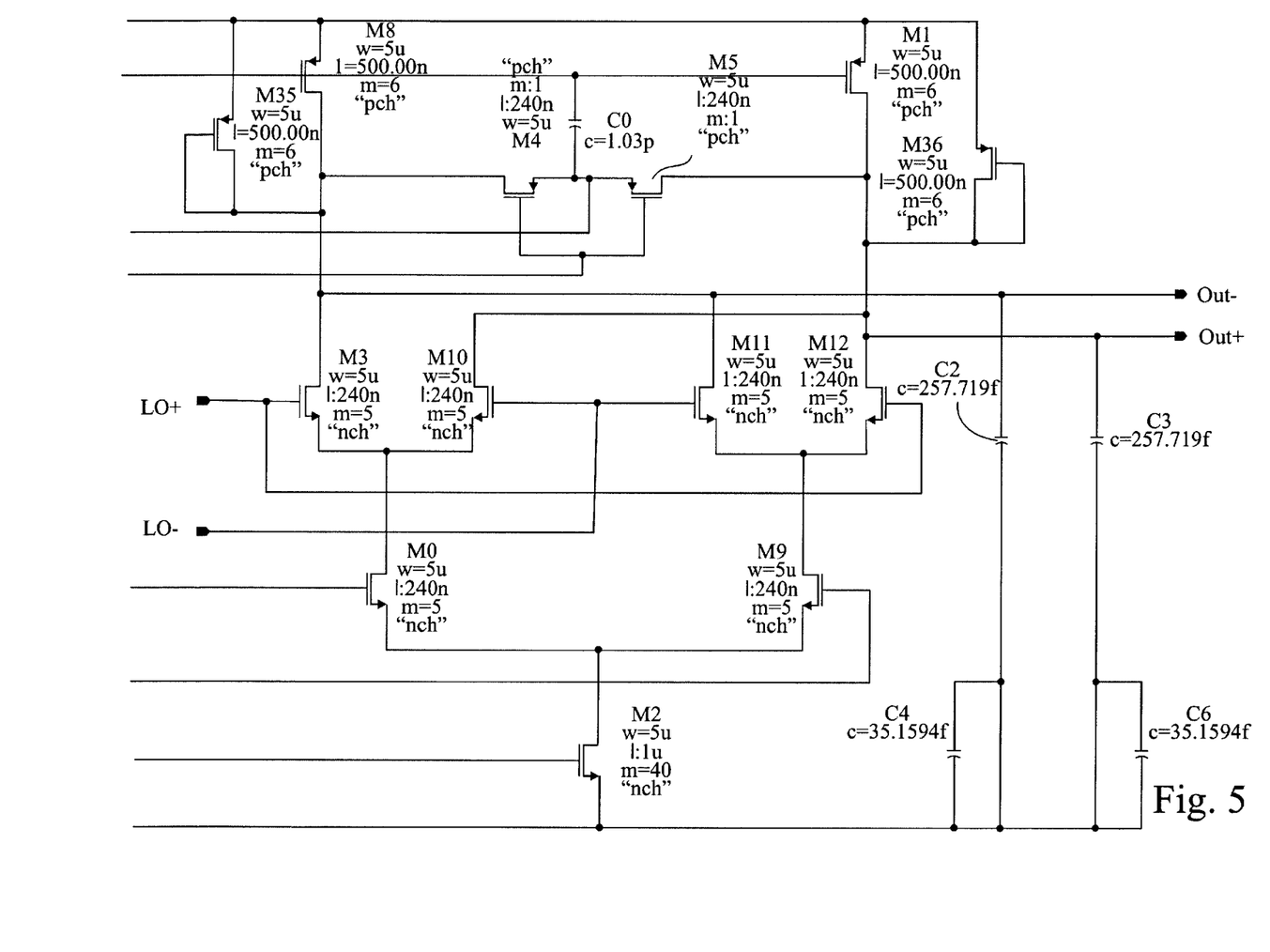
FIG. 5 is a schematic of one embodiment of an I/Q mixer.

FIG. 5 is one embodiment of the I/Q quadrature mixer. The operation of I/Q quadrature mixer would be apparent to one skilled in the art.

Transceiver Overview

Figure 6:
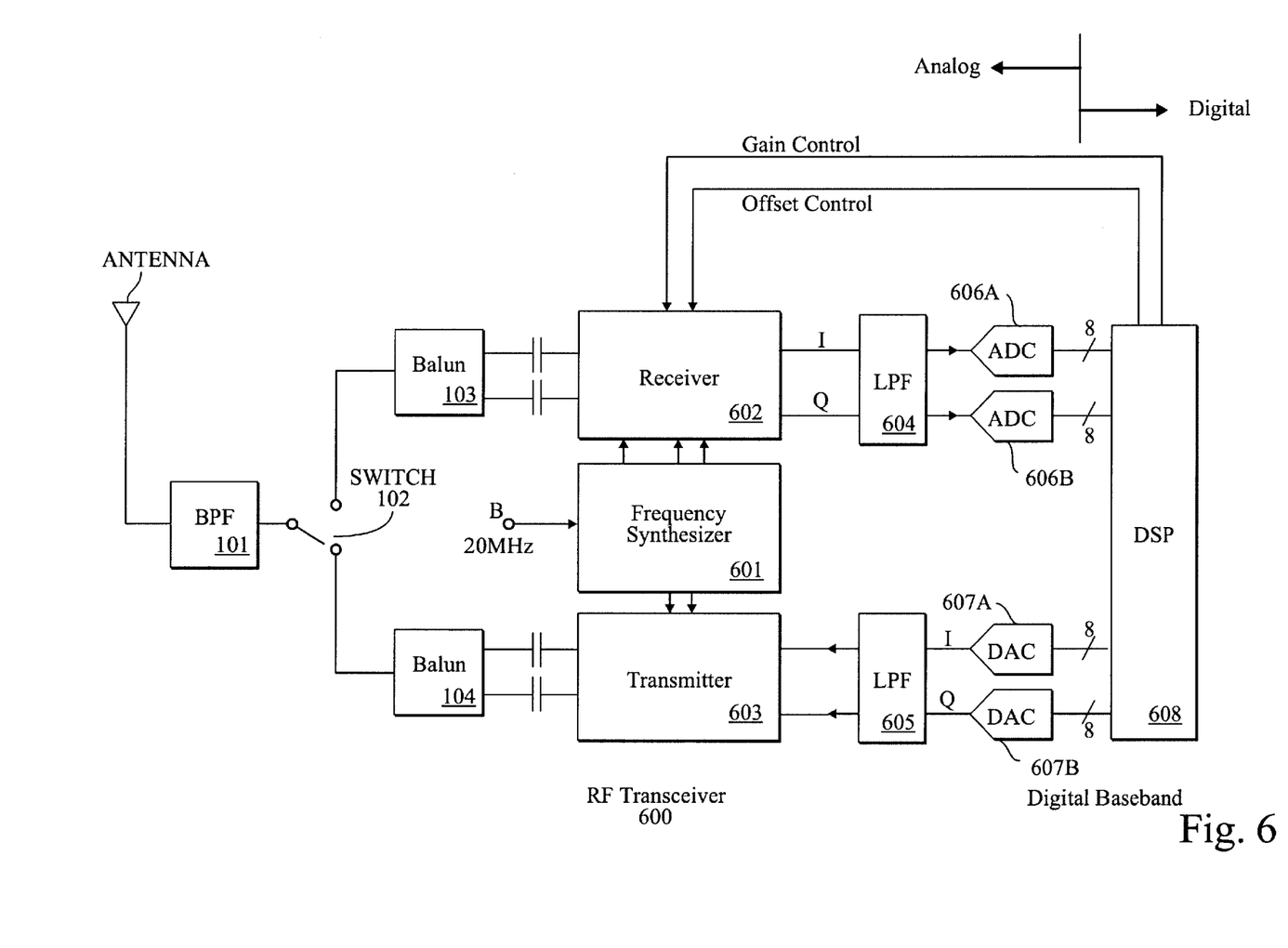
FIG. 6 is a block diagram of one embodiment of a communication device.

One embodiment of a radio that includes the RF front-end described above is shown in FIG. 6. Referring to FIG. 6, the radio contains a front-end 600, such as shown in FIG. 1, which is shown as receiver 602, transmitter 603, and frequency synthesizer 601. Frequency synthesizer 601 supplies clock signals to receiver 602 and transmitter 603 using a 20 MHz input signal.

The I and Q signals of the receive path of the front-end are coupled to a low pass filter (LPF) 604, which filters signals at frequencies above a predetermined frequency (set based on the design). The filtered signals are converted to digital using analog-to-digital converters (ADCs) 606A and 606B. The digital signals are input to digital signal processor (DSP) 608.

The I and Q signals input to transmitter 603 of the transmit path of the front-end are received from LPF 605, which filters I and Q signals from digital-to-analog converters (DACs) 607A and 607B. DACs 607A and 607B receive signals from DSP 608.

DSP 608 performs the processing associated with modulation and demodulation signals. In one embodiment, DSP 608 generates gain and offset control signals that are sent to the RF front end to control the front end in a manner well-known in the art.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the various embodiments are not intended to limit the scope of the claims which in themselves recite only those features regarded as essential to the invention.

Thus, a multistage mixing architecture for an RF front-end has been described.

I claim:

1. A radio-frequency (RF) front-end comprising:
    a low noise amplifier (LNA) to amplify a received signal at a carrier frequency, the LNA having inductive loads;
    a first mixer, coupled to the low noise amplifier, to mix an amplified received signal with a first local oscillator (LO) signal to down convert the amplified received signal to an intermediate frequency (IF), the first mixer having inductive loads, wherein the IF is related to the carrier frequency such that an image channel associated with the carrier and the frequency of the LO signal is outside the bandwidth of the inductive loads of the LNA;
    an I/Q quadrature mixer stage having a second mixer and a third mixer coupled to the first mixer, the I/Q quadrature mixer converting the amplified received signal at the IF to I and Q signals using a second LO signal related to the first LO signal.

2. The RF front-end defined in claim 1 wherein the IF is no greater than 80 percent of the carrier frequency.

3. The RF front-end defined in claim 1 wherein the carrier frequency is 5.3 GHz and the first frequency is 4.24 GHz.

4. The RF front-end defined in claim 1 further comprising a divide-by-four to divide the first local oscillator signal by four to generate the second local oscillator signal.

5. The RF front-end defined in claim 1 wherein the LNA is capacitively coupled to the first mixer.

6. The RF front-end defined in claim 1 wherein the LNA is coupled to the first mixer using a coupling capacitor.

7. The RF front-end defined in claim 1 wherein the first mixer is capacitively coupled to the I/Q quadature mixer stage.

8. The RF front-end defined in claim 1 wherein the first mixer is capacitively coupled to the I/Q quadature mixer stage using a coupling capacitor.

9. A radio-frequency (RF) front-end comprising:
    a low noise amplifier (LNA) to amplify a received signal at a carrier frequency, the LNA having inductive loads;
    a first mixer coupled to the low noise amplifier, the first mixer to mix an amplified received signal with a first local oscillator signal to down convert the amplified received signal to an intermediate frequency (IF), the first mixer having inductive loads, wherein the IF is related to the carrier frequency such that the IF is no greater than 80 percent of the carrier frequency; and
    an I/Q quadrature mixer stage having a second mixer and a third mixer coupled to the first mixer, the I/Q quadrature mixer converting the amplified received signal at the IF to I and Q signals using a second local oscillator related to the first local oscillator.

10. The RF front-end defined in claim 9 wherein the carrier frequency is 5.3 GHz and the IF is 4.24 GHz.

11. The RF front-end defined in claim 9 further comprising a divide-by-four to divide the first local oscillator signal by four to generate the second local oscillator signal.

12. The RF front-end defined in claim 9 wherein the LNA is coupled to the first mixer using a coupling capacitor.

13. The RF front-end defined in claim 9 wherein the first mixer is capacitively coupled to the I/Q quadature mixer stage using a coupling capacitor.

14. A communication device comprising:
    a radio frequency (RF) front end comprising
        a low noise amplifier (LNA) to amplify a received signal at a carrier frequency, the LNA having inductive loads,
        a first mixer, coupled to the low noise amplifier, to mix an amplified received signal with a first local oscillator (LO) signal to down convert the amplified received signal to an intermediate frequency (IF), the first mixer having inductive loads, wherein the IF is related to the carrier frequency such that an image channel associated with the carrier and the frequency of the LO signal is outside the bandwidth of the inductive loads of the LNA,
        an I/Q quadrature mixer stage having a second mixer and a third mixer coupled to the first mixer, the I/Q quadrature mixer converting the amplified received signal at the IF to I and Q signals using a second LO signal related to the first LO signal;
    a filter coupled to the RF front end;
    an analog-to-digital converter (ADC) coupled to the filter; and
    a processor coupled to the ADC.

* * * * *

UNITED STATES PATENT AND TRADEMARK OFFICE
CERTIFICATE OF CORRECTION

PATENT NO. : 6,351,502 B1  Page 1 of 1
DATED : February 26, 2002
INVENTOR(S) : Zargari et al.

It is certified that error appears in the above-identified patent and that said Letters Patent is hereby corrected as shown below:

Column 1,
Line 30, delete "dose" and insert -- close --.

Column 2,
Line 1, delete "if".

Signed and Sealed this

Third day of September, 2002

Attest:

Attesting Officer

JAMES E. ROGAN
Director of the United States Patent and Trademark Office